(12) United States Patent
Petroff

(10) Patent No.: US 8,311,230 B2
(45) Date of Patent: Nov. 13, 2012

(54) SPEAKER SYSTEMS AND METHODS HAVING AMPLITUDE AND FREQUENCY RESPONSE COMPENSATION

(75) Inventor: Michael L. Petroff, Marina del Rey, CA (US)

(73) Assignee: THOMSON Licensing, Issy les Moulineaux (FR)

( * ) Notice: Subject to any disclaimer, the term of this patent is extended or adjusted under 35 U.S.C. 154(b) by 2357 days.

(21) Appl. No.: 10/789,425

(22) Filed: Feb. 27, 2004

(65) Prior Publication Data

US 2005/0190927 A1   Sep. 1, 2005

(51) Int. Cl.
*H03G 3/20* (2006.01)
*H03G 3/00* (2006.01)
*H04R 29/00* (2006.01)

(52) U.S. Cl. ............. 381/57; 381/56; 381/104; 381/108
(58) Field of Classification Search ..................... 381/50, 381/59, 57, 103, 104–109, 56
See application file for complete search history.

(56) References Cited

U.S. PATENT DOCUMENTS

| 3,934,084 | A |   | 1/1976  | Munson et al. |           |
|-----------|---|---|---------|---------------|-----------|
| 4,554,533 | A | * | 11/1985 | Bosnak        | 340/514   |
| 5,526,419 | A | * | 6/1996  | Allen et al.  | 379/391   |
| 5,588,065 | A | * | 12/1996 | Tanaka et al. | 381/96    |
| 5,796,852 | A | * | 8/1998  | Yamaguchi     | 381/104   |
| 6,094,481 | A | * | 7/2000  | Deville et al.| 379/388.03|
| 2003/0123680 | A1 | * | 7/2003 | Lee et al.   | 381/104   |
| 2004/0105559 | A1 | * | 6/2004 | Aylward et al.| 381/103  |

* cited by examiner

*Primary Examiner* — Yuwen Pan
*Assistant Examiner* — George Monikang
(74) *Attorney, Agent, or Firm* — Robert D. Shedd; Robert B. Levy; Jorge Tony Villabon

(57) ABSTRACT

A speaker system and method, in which the intelligibility of reproduced speech or music sound, derived from an audio program signal, is enhanced by means of at least one of a first and second transfer function of a signal process applied to the audio program signal. The first transfer function incrementally varies the volume of the reproduced sound directly as a function of the volume of ambient noise. The second transfer function incrementally or continuously varies the high frequency response of the reproduced sound inversely as a function of the volume of the ambient noise. The ambient noise can be measured by a microphone, for example, located on or near the speaker system and can also be electronically averaged over a predetermined time period. The signal process provides an audio output signal that is applied to at least one amplifier and at least one speaker.

28 Claims, 4 Drawing Sheets

SPEAKER SYSTEMS AND METHODS HAVING AMPLITUDE AND FREQUENCY RESPONSE COMPENSATION

BACKGROUND OF THE INVENTION

1. Field of the Invention

Generally, the present invention relates to the speaker systems and methods. More specifically, the present invention relates to a speaker systems and methods having amplitude and frequency compensation as a function of ambient noise.

2. Description of the Related Art

In the field of speaker system design and implementation, many factors play a decisive role in determine, for example, what types of speakers to use, how large the speakers should be, what frequency response the speakers should have, and so on. One of the more important off these factors is the environment in which the speakers must operate. Specifically, the frequencies and amplitudes of the ambient noise surrounding the speakers-operational area must be considered.

Conventional speakers of today are utilized, for example, to present audio or audio/video advertisements in commercial and retail store environments where ambient noise levels may vary widely over time. It is known in the audio field that the intelligibility of reproduced speech or music sound in such environments, derived from an audio program signal, is strongly affected by the ratio of the volume of the reproduced sound to the volume of ambient noise. Intelligibility may therefore be enhanced by processing the audio program signal in such a manner as to vary the volume of the reproduced sound directly as a function of the volume of the ambient noise. Further, it is known in the audiology field that the intelligibility of a hearing aid microphone output signal containing both live speech and ambient noise signal components can be enhanced through a signal process that introduces both compressed gain and increasing high frequency feedback in response to decreasing amplitude of such speech and noise signal.

For example, U.S. Pat. No. 3,934,084 to Munson describes an audio amplifier system that includes a variable gain amplifier adapted to receive an input signal, means for detecting periods when the input signal falls below a predetermined level, and sound transducer means arranged to provide a signal proportional to the sound level in the area or part thereof covered by the system for controlling the gain of the amplifier. An inhibitor is provided which is arranged to be controlled by the detecting means so as to prevent any change of the gain of the variable gain amplifier except during periods when the input signal falls below the said predetermined level.

FIG. 1 illustrates a typical audio/video speaker system as is know in the art today. As shown in FIG. 1, the audio program input signal $S_{in}$, typically consisting of summed left and right stereo signals, is applied to signal input s of prior art signal process $P_1$. $P_1$ output port o provides signal process output signal $S_{out1}$. $P_1$ introduces transfer function $f_1$ providing continually increasing gain of $S_{in}$ with increasing amplitude of a signal process control signal described below. Microphone MIC1 provides an output signal S1 applied to level detector D1, which provides an output DC microphone signal S2 applied to signal input s of electronic switch E1. $S_{in}$ is also applied to level detector D2, which provides an output DC program signal S4 applied to control input c of electronic switch E1. S2 transfers to signal output o of electronic switch E1, providing signal process control signal S3 only when DC program signal S4 is in the off state, which occurs when $S_{in}$ is below a minimum threshold level. S3 is applied to control input c of signal process $P_1$ and thereby determines transfer function $f_1$.

Such conventional speaker systems provide amplitude compensation linearly and directly as a function of the changing ambient noise. This linear compensation is a transfer function $f_1$ expressed by the equation $f_1(S_{an})=(S_{in} \times S_{an})$, where $S_{in}$ is the program input signal amplitude and $S_{an}$ is the ambient noise signal amplitude. However, the above linear transfer function is non-optimal for at least retail store and other commercial environments, which commonly exhibit frequent and widely varying changes in ambient noise, since the conventionally compensated speaker output signal provides commensurately frequent and widely varying changes in sound levels that can be annoying to listeners. Thus, what is needed is a speaker system providing direct, but incremental, amplitude compensation as a function $f_i$ of such frequent and widely varying changes in ambient noise.

SUMMARY OF THE INVENTION

The present invention is a commercial speaker system in which the intelligibility of reproduced speech or music sound, derived from an audio program signal, is enhanced by means of at least one of a first and second transfer function of a signal process applied to such audio program signal, wherein the first transfer function incrementally varies the volume of the reproduced sound, for example in steps of 1 to 10 dB, directly as a function of the volume of ambient noise, and wherein the second transfer function incrementally or continuously varies the high frequency response of the reproduced sound inversely as a function of the volume of the ambient noise. The ambient noise can be measured by a microphone, for example, located on or near the speaker system and can also be electronically averaged over a predetermined time period. The signal process provides an audio output signal that is applied to at least one amplifier and at least one speaker.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1:
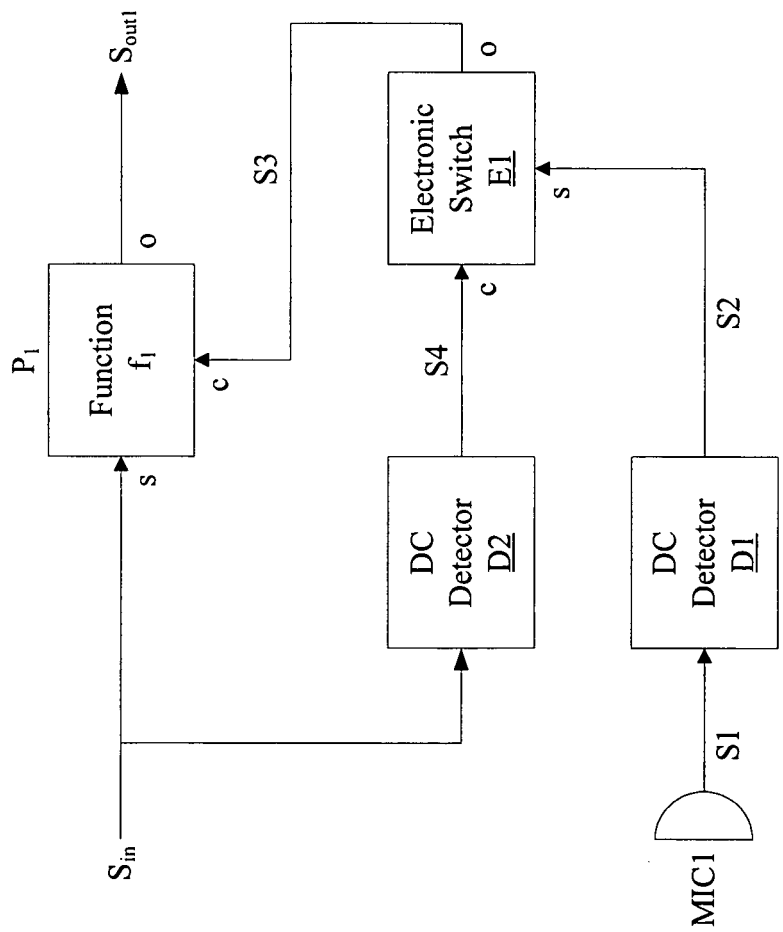
FIG. 1 illustrates a typical audio/video speaker system as is know in the art today.

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components referred to herein by way of illustration.

Equivalent variations of the signal process, circuitry and features of preferred and alternative embodiments of the present invention, including but not limited to the equivalent use of DSP or microcontroller circuitry to implement substantially the same functions, may be practiced without altering the basic principles of the present invention. Further, some functions of the present invention are described in terms of hardware and some as software. Such descriptions are merely for descriptive purposes and are not meant to limit the scope of the invention in any way. The present invention is not dependent upon a specific hardware or software implementation.

It has been determined in experiments conducted by the present inventor that the intelligibility of a reproduced program signal in the presence of widely varying ambient noise levels is substantially enhanced by a signal process with processing functions that are incremental, as opposed to continuous, such that the volume of the reproduced sound does not change too frequently as a consequence of rapidly occurring large changes in the ambient noise. Such signal process can provide increasing gain and increasing high frequency response of the program signal as a function of decreasing amplitude of a microphone output signal comprising at least one of (a), ambient noise signal components without reproduced program signal components by enabling such microphone output signal only while the program signal is substantially off, which typically occurs between audio or audio/video advertisements, or (b) ambient noise with reproduced program signal components by enabling such microphone output signal only while the program signal is substantially on, which typically occurs during audio or audio/video advertisements. The signal process parameters are maintained between such times as the microphone is enabled to provide continuing and stable sound reproduction.

An embodiment of the present invention is a commercial speaker system that receives an input audio program signal. The input audio program signal can be from any source, such as a CD, DVD, MPEG, tape, live broadcast, etc., and can consists a mono-signal or of summed left and right stereo signals. The speaker system of this embodiment can comprise a signal process and transfer function for enhancing the intelligibility of the reproduced program signal in the presence of widely varying ambient noise levels over discrete time increments. Such a transfer function can incrementally vary the volume of the reproduced sound, for example in steps of about 1 dB to about 10 dB, directly as a function of the volume of ambient noise, whereby such incremental variations ensure that the volume of the reproduced sound does not change too frequently as a consequence of rapidly occurring changes in the ambient noise. The ambient noise can be measured by a microphone or other similar sound input device, and can be located on or near the speaker system. Further, the ambient noise input can be electronically averaged over a predetermined time period.

The signal process of this embodiment can provide an audio output signal that might be applied to at least one amplifier and at least one speaker. The system provides and utilizes ambient noise signal components without reproduced program signal components by enabling the microphone signal while the program signal is substantially off, which might occur, for example, between audio or audio/video advertisements segments or between conversation or music segments. According to at least one embodiment of the present invention, these substantially off periods can be, for example as short as about 100 milliseconds (ms), but typically might be between about 100 to about 1000 ms. However such timing constraints can vary with the installation environment and design implementation. The signal process can be maintained unchanging between such times as the microphone signal is enabled to provide continuing sound reproduction.

Figure 2:
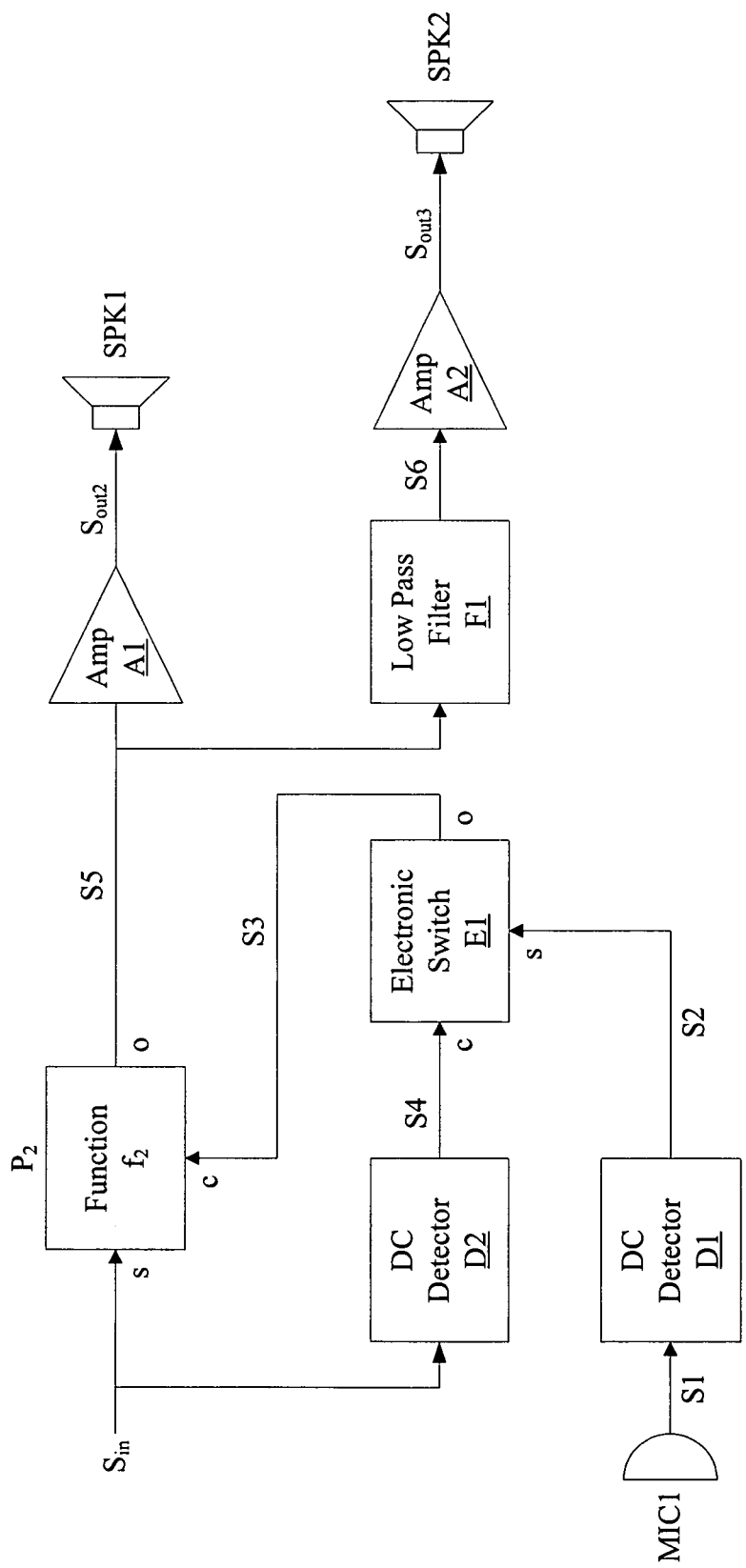
FIG. 2 illustrates a first embodiment of an audio/video speaker system according to the present invention.

FIG. 2 illustrates a first embodiment of an audio/video speaker system according to the present invention. As shown in FIG. 2, the program input signal $S_{in}$ is applied to signal input s of signal process $P_2$. $P_2$ output port o provides signal process output signal S5. $P_2$ introduces transfer function $f_2$ providing incrementally increasing gain, for example, in steps of about 1 dB to about 10 dB, to $S_{in}$ as a function of increasing amplitude of a signal process control signal, and vice versa, described below. This transfer function $f_2$ can, for example, be a non-linear equation of the form $f_2(S_{an})=(S_{in} \times S_{anI})$, where $S_{anI}$ is the ambient noise signal amplitude in increments of, for example, about 1 dB to about 10 dB. As will be evident to those skilled in the art, functions $f_2$ may be effectively implemented through hardware, firmware, software or a combination thereof. Microphone MIC1 provides an output signal S1 applied to level detector D1, which provides an output DC microphone signal S2 applied to signal input s of electronic switch E1. $S_{in}$ is also applied to level detector D2, which provides an output DC program signal S4 applied to control input c of electronic switch E1. S2 transfers to signal output o of electronic switch E1, providing signal process control signal S3 only when DC program signal S4 is in the off state, which occurs when $S_{in}$ is off or substantially off, for example, below a minimum threshold level. S3 is applied to control input c of signal process $P_2$ and thereby determines transfer function $f_2$.

The signal process $P_2$ of FIG. 2 is maintained between such times as the microphone output signal is enabled (that is, switched through to the control input of the signal process) to provide continuing sound reproduction using the previously determined ambient noise level or average of levels. Signal process output signal S5 can be applied to first amplifier A1 having output signal $S_{out2}$ applied to first speaker SPK1. The specific amplification used can be determined based at least in part on the type of speaker used and the desired volume of the target listener. Where low frequency performance enhancement is also desired, S5 can optionally be applied to low-pass filter F1 having filtered output signal S6, which is applied to second amplifier A2 having output signal $S_{out3}$ applied to second speaker SPK2. According to one aspect of this embodiment, the cut-off frequency of low-pass filter F1 might be approximately 400 Hz. However, a range of between about 100 Hz to about 600 Hz or more can also be effective for the present invention. In this manner, the output of the signal process is amplified by a first amplifier and optionally a second amplifier, the outputs of which are applied to the speakers. The speakers can be, for example, comprise a single speaker driver having a diaphragm diameter not greater than substantially 100 centimeters (cm) and producing a wide-dispersion sound field.

Figure 3:
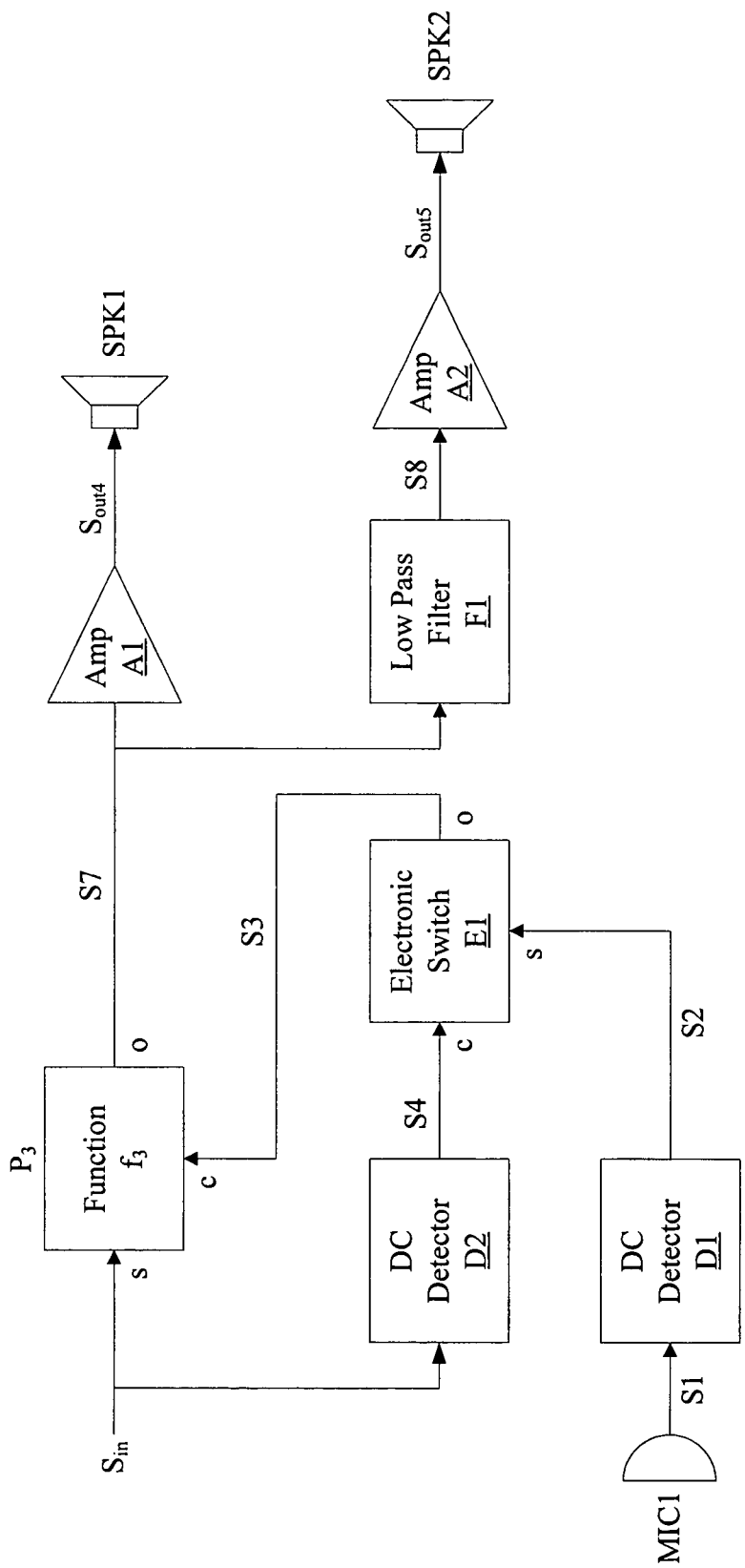
FIG. 3 illustrates a second embodiment of an audio/video speaker system according to the present invention.

FIG. 3 illustrates a second embodiment of an audio/video speaker system according to the present invention. As shown in FIG. 3, the program input signal $S_{in}$ is applied to signal input s of signal process $P_3$. $P_3$ output port o provides signal process output signal S7. $P_3$ introduces transfer function $f_3$ providing increasing high frequency response to $S_{in}$ as a function of increasing amplitude of a signal process control signal, and vice versa, described below. This transfer function $f_3$ can, for example, be a non-linear equation of the form $f_3(S_{an})=(S_{inHF}/S_{an})$, where $S_{inHF}$ is the high frequency response signal. As will be evident to those skilled in the art, functions $f_3$ may be effectively implemented through hardware, firmware, software or a combination thereof. Microphone MIC1 provides an output signal S1 applied to level detector D1, which provides an output DC microphone signal S2 applied to signal input s of electronic switch E1. $S_{in}$ is also applied to level detector D2, which provides an output DC program signal S4 applied to control input c of electronic switch E1. S2 transfers to signal output o of electronic switch E1, providing signal process control signal S3 only when DC program signal S4 is in the off state, which occurs when $S_{in}$ is off or substantially off, for example, below a minimum threshold level. S3 is applied to control input c of signal process $P_3$ and thereby determines transfer function $f_3$.

The signal process $P_3$ of FIG. 3 is maintained between such times as the microphone output signal is enabled (that is, switched through to the control input of the signal process) to provide continuing sound reproduction using the previously determined ambient noise level or average of levels. Signal process output signal S7 is applied to first amplifier A1 having output signal $S_{out4}$ applied to first speaker SPK1. Where low frequency performance enhancement is also desired, S7 is optionally applied to low-pass filter F1 having filtered output signal S8, which is applied to second amplifier A2 having output signal $S_{out5}$ applied to second speaker SPK2. According to one aspect of this embodiment, the cut-off frequency of low-pass filter F1 might be approximately 400 Hz. However, a range of between about 100 Hz to about 600 Hz or more can also be effective for the present invention. In this manner, the output of the signal process is amplified by a first amplifier and optionally a second amplifier, the outputs of which are applied to the speakers. The speakers can be, for example, comprise a single speaker driver having a diaphragm diameter not greater than substantially 100 centimeters (cm) and producing a wide-dispersion sound field.

Figure 4:
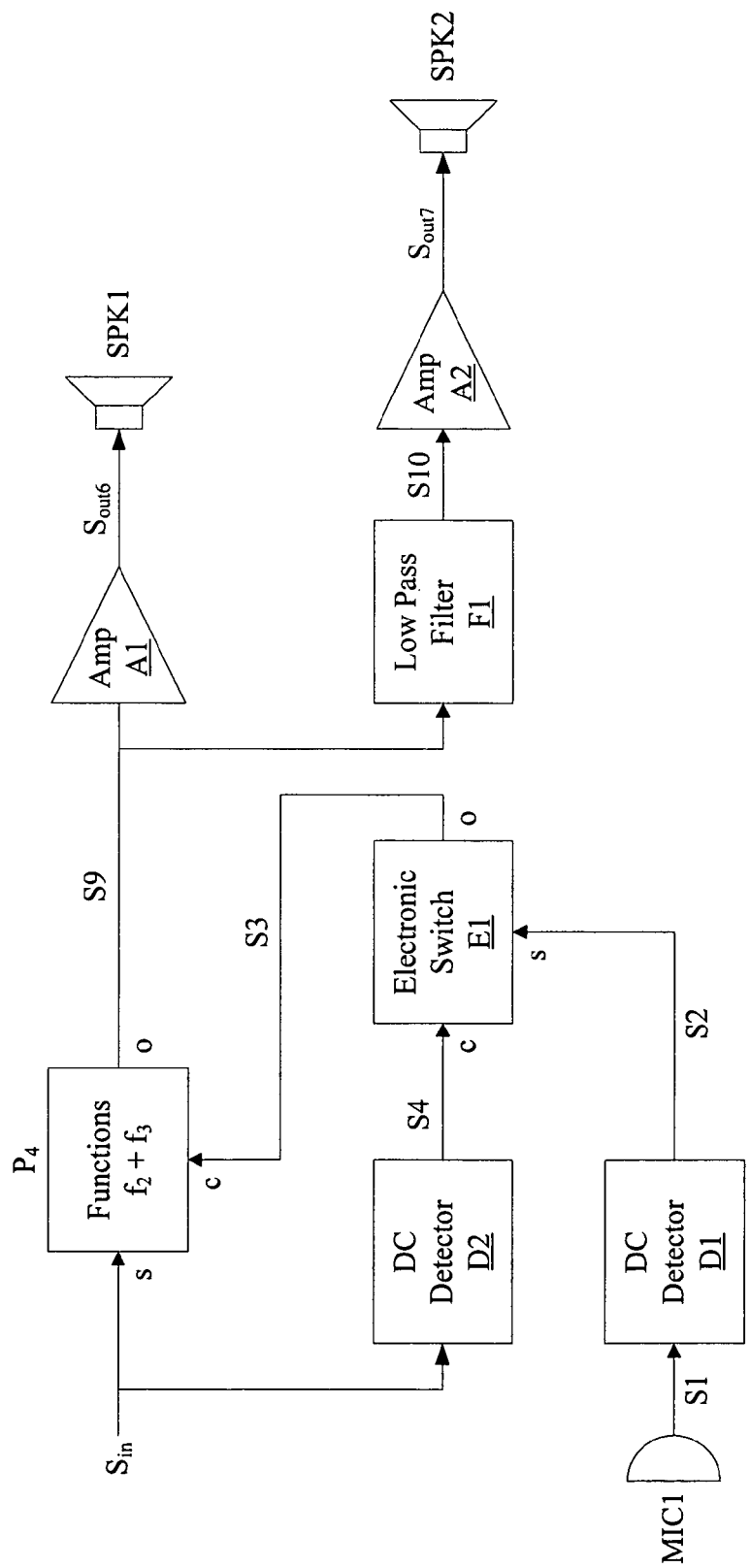
FIG. 4 illustrates a third embodiment of an audio/video speaker system according to the present invention.

FIG. 4 illustrates a third embodiment of an audio/video speaker system according to the present invention. As shown in FIG. 4, the program input signal $S_{in}$ is applied to signal input s of signal process $P_4$. $P_4$ output port o provides signal process output signal S9. $P_4$ introduces the combination of transfer functions $f_2$ and $f_3$. As previously described, above, $f_2$ and $f_3$ provide (a) incrementally increasing gain, typically in steps of about 1 to 10 dB, to $S_{in}$ as a function of increasing amplitude of a signal process control signal, and vice versa, described below, and (b) increasing high frequency response to $S_{in}$ as a function of decreasing amplitude of such signal process, and vice versa, described below, respectively. Microphone MIC1 provides an output signal S1 applied to level detector D1, which provides an output DC microphone signal S2 applied to signal input s of electronic switch E1. $S_{in}$ is also applied to level detector D2, which provides an output DC program signal S4 applied to control input c of electronic switch E1. S2 transfers to signal output o of electronic switch E1, providing signal process control signal S3 only when DC program signal S4 is in the off state, which occurs when $S_{in}$ is off or substantially off, for example, below a minimum threshold level. S3 is applied to control input c of signal process $P_4$ and thereby determines both transfer functions $f_2$ and $f_3$.

The signal process $P_4$ of FIG. 4 is maintained between such times as the microphone output signal is enabled (that is, switched through to the control input of the signal process) to provide continuing sound reproduction using the previously determined ambient noise level or average of levels. Signal process output signal S9 is applied to first amplifier A1 having output signal $S_{out6}$ applied to first speaker SPK1. Where low frequency performance enhancement is also desired, S9 is optionally applied to low-pass filter F1 having filtered output signal S10, which is applied to second amplifier A2 having output signal $S_{out7}$ applied to second speaker SPK2. According to one aspect of this embodiment, the cut-off frequency of low-pass filter F1 might be approximately 400 Hz. However, a range of between about 100 Hz to about 600 Hz or more can also be effective for the present invention. In this manner, the output of the signal process is amplified by a first amplifier and optionally a second amplifier, the outputs of which are applied to the speakers. The speakers can be, for example, comprise a single speaker driver having a diaphragm diameter not greater than substantially 100 centimeters (cm) and producing a wide-dispersion sound field.

The present invention can be implemented a vast array of environments, too many to enumerate herein, but readily discernable by those skilled in the art in view of the foregoing discussion. As will further be evident by those skilled in the art in view of the present invention, the physical location of the components of the invention, including the relative locations of the components, might be dictated by each environment and can vary between environments. All of such use environments and physical implementations are meant to be within the scope of the present invention. For example, embodiments of the present invention might be used as part of a hands-free automobile cellular telephone system, where the ambient noise inside the automobile might change with varying automobile speeds and surrounding traffic. As another example, embodiments of the present invention might be used as part of a fast food restaurant drive-through ordering system, where the ambient noise at the ordering kiosk might vary according to weather conditions and the customer's automobile noise. As a further example, embodiments of the present invention might be used as part of a retail store, check-out line, advertising system, where the ambient noise at in the check-out line might vary with store crowdedness and customer conversations.

Although the present invention has been particularly described with reference to the preferred embodiments thereof, it should be readily apparent to those of ordinary skill in the art that changes and modifications in the form and details thereof may be made without departing from the spirit and scope of the invention. For example, those skilled in the art will understand that variations can be made in the number and arrangement of the components illustrated in the above block diagrams and that these components can be physically or functionally combined or divided to fit a particular application or environment. It is intended that the scope of the appended claims include such changes and modifications.

What is claimed is:

1. A speaker system providing enhanced intelligibility of a reproduced audio program signal in the presence of ambient noise, the speaker system comprising: means for receiving the reproduced audio program signal; a microphone for monitoring at least ambient noise signals and for providing a microphone output signal; means for enabling the microphone output signal during first increments of time when the reproduced audio program signal is (—cancelled) off, and disabling the microphone output signal during second increments of time when the reproduced audio program signal is on, such that the microphone output signal includes ambient noise signal components without including reproduced audio program signal components; and a signal process, in communication with the means for receiving and the means for enabling/disabling, for applying a first transfer function to the reproduced audio program signal, the first transfer function incrementally increasing gain adjustments to the reproduced audio program signal as a function of an increasing average amplitude of the microphone output signal over a period of time during which said microphone output signal is enabled, and incrementally decreasing gain adjustments to the reproduced audio program signal as a function of a decreasing average amplitude of the microphone output signal over a period of time during which said microphone output signal is enabled.

2. The speaker system according to claim 1, wherein the incremental gain adjustments are in steps of between 1 dB and about 10 dB.

3. The speaker system according to claim 1, further comprising a first amplifier having an input and an output, the first amplifier input coupled to the output signal of the signal processor and the first amplifier output coupled to an input of a first speaker.

4. The speaker system according to claim 3, wherein the first speaker comprises a single speaker driver having a diaphragm diameter not greater than about 100 centimeters (cm).

5. The speaker system according to claim 3, further comprising:
   a low-pass filter having an input and an output, the filter input coupled to the output signal of the signal processor and the filter output augmenting the first speaker output in a low frequency region; and
   a second amplifier having an input and output, the second amplifier input coupled to the filter output and the second amplifier output coupled to an input of a second speaker.

6. The speaker system according to claim 5, wherein the first and second speakers each comprise a single speaker driver having a diaphragm diameter not greater than about 100 centimeters (cm).

7. A speaker system providing enhanced intelligibility of a reproduced audio program signal in the presence of ambient noise, the speaker system comprising: means for receiving the reproduced audio program signal; a microphone for monitoring ambient noise signals and for providing a microphone output signal; means for enabling the microphone output signal during first increments of time when the reproduced audio program signal is (—cancelled) off, and disabling the microphone output signal during second increments of time when tile reproduced audio program signal is on, such that the microphone output signal includes ambient noise signal components without including reproduced program signal components; and a signal processor, in communication with the means for receiving and the means for enabling/disabling for applying a transfer function to the reproduced audio program signal, the transfer function incrementally increasing high frequency response of the reproduced audio program signal as a function of a decreasing amplitude of the microphone output signal averaged over a period of time during which said microphone output signal is enabled, and vice versa, wherein the signal process output signal is maintained during such times as the microphone output signal is disabled.

8. The speaker system according to claim 7, further comprising a first amplifier having an input and an output, the first amplifier input coupled to the output signal of the signal processor and the first amplifier output coupled to an input of a first speaker.

9. The speaker system according to claim 8, wherein the first speaker comprises a single speaker driver having a diaphragm diameter not greater than about 100 centimeters (cm).

10. The speaker system according to claim 8, further comprising:
    a low-pass filter having an input and an output, the filter input coupled to the output signal of the signal processor and the filter output augmenting the first speaker output in a low frequency region; and
    a second amplifier having an input and output, the second amplifier input coupled to the filter output and the second amplifier output coupled to a second speaker.

11. The speaker system according to claim 10, wherein the first and second speakers each comprise a single speaker driver having a diaphragm diameter not greater than about 100 centimeters (cm).

12. A speaker system providing enhanced intelligibility of a reproduced audio program signal in the presence of ambient noise, the speaker system comprising: means for receiving the reproduced audio program signal; a microphone for monitoring ambient noise signals and for providing a microphone output signal; means for enabling the microphone output signal during first increments of time when the reproduced audio program signal is (—cancelled) off, and disabling the microphone output signal during second increments of time when the reproduced audio program signal is on, such that the microphone output signal includes ambient noise signal components without including reproduced program signal components; and a signal processor, in communication with the means for receiving and the means for enabling/disabling, including a first transfer function and a second transfer function having at least one signal processor output signal, wherein: the first transfer function provides incrementally increasing gain adjustments to the reproduced audio program signal as a function of an increasing average amplitude of the microphone output signal over a period of time during which said microphone output signal is enabled, and vice versa; the second transfer function provides incrementally increasing high frequency response of the reproduced audio program signal as a function of a decreasing average amplitude of the microphone output signal over a period of time during which said microphone output signal is enabled, and vice versa; and the at least one signal processor output signal is maintained during such time as the microphone output signal is disabled.

13. The speaker system according to claim 12, wherein the incremental gain adjustments are in steps of between about 1 dB and about 10 dB.

14. The speaker system according to claim 12, further comprising a first amplifier having an input and an output, the first amplifier input coupled to the at least one output signal of the signal processor and the first amplifier output coupled to a first speaker.

15. The speaker system according to claim 14, wherein the first speaker comprises a single speaker driver having a diaphragm diameter not greater than about 100 centimeters (cm).

16. The speaker system according to claim 14, further comprising:
    a low-pass filter having an input and an output, the filter input coupled to the at least one output signal of the signal processor and the filter output augmenting the first speaker output in a low frequency region; and
    a second amplifier having an input and output, the second amplifier input coupled to the filter output and the second amplifier output coupled to a second speaker input of a second speaker.

17. The speaker system according to claim 16, wherein the first and second speakers each comprise a single speaker driver having a diaphragm diameter not greater than about 100 centimeters (cm).

18. A method of enhanced intelligibility of a reproduced audio program signal in the presence of ambient noise in a speaker system comprising:
    receiving the reproduced audio program signal; monitoring ambient noise signals using a microphone to provide a microphone output signal; enabling the microphone output signal during first increments of time when the reproduced audio program signal is (—cancelled) off, and disabling the microphone output signal during second increments of the time when the reproduced audio program signal is on, such that the microphone output signal includes ambient noise signal components without including reproduced program signal components; and processing the reproduced audio program signal and the microphone output signal using a first transfer function, the first transfer function having a signal process output signal, the first transfer function providing incrementally increasing gain adjustments to the reproduced audio program signal as a function of an increasing average amplitude of the microphone output signal over a period of time during which said microphone output signal is enabled, and incrementally decreasing gain adjustments to the reproduced audio program signal as a function of a decreasing average amplitude of the microphone output signal over a period of time during which said microphone output signal is enabled.

19. The method according to claim 18 wherein the incremental gain adjustments are in steps of between about 1 dB and about 10 dB.

20. The method according to claim 18, further comprising:
amplifying the signal process output signal using a first amplifier to produce a first amplified output signal; and
coupling the first amplified output signal to a first speaker input of a first speaker.

21. The method according to claim 20, further comprising:
filtering the signal process output signal using a low-pass filter to produce a filtered output signal;
amplifying the filtered output signal using a second amplifier to reproduce a second amplified output signal; and
coupling the second amplified output signal to an input of a second speaker.

22. A method of enhanced intelligibility of a reproduced audio program signal in the presence of ambient noise in a speaker system, the method comprising: receiving the reproduced audio program signal; monitoring ambient noise signals using a microphone to provide a microphone output signal; enabling the microphone output signal during first increments of time when the reproduced audio program signal is (—cancelled) off, and disabling the microphone output signal during second increments of time when the reproduced audio program signal is on, such that the microphone output signal includes ambient noise signal without including reproduced program signal components; and processing the reproduced audio program signal and the microphone output signal using a second transfer function, the second transfer function providing incrementally increasing high frequency response of the reproduced audio program signal as a function of a decreasing average amplitude of the microphone output signal over a period of time during which said microphone output signal is enabled, and vice versa, wherein the signal process output signal is maintained during such times as the microphone output signal is disabled.

23. The method according to claim 22, further comprising:
amplifying the signal process output signal using a first amplifier to produce a first amplified output signal; and
coupling the first amplified output signal to a first speaker input of a first speaker.

24. The method according to claim 23, further comprising:
filtering the signal process output signal using a low-pass filter to produce a filtered output signal;
amplifying the filtered output signal using a second amplifier to produce a second amplified output signal; and
coupling the second amplified output signal to an input of a second speaker.

25. A method of enhanced intelligibility of a reproduced audio program signal in the presence of ambient noise in a speaker system comprising: receiving the reproduced audio program signal; monitoring ambient noise signals using a microphone to provide a microphone output signal; enabling the microphone output signal during first increments of time when the reproduced audio program signal is (—cancelled) off, and disabling the microphone output signal during second increments of time when the reproduced audio program signal is on, such that the microphone output signal includes ambient noise signal components without including reproduced program signal components; and processing the reproduced audio program signal and the microphone output signal using a first transfer function and a second transfer function, the first and second transfer functions having at least one signal process output signal, wherein: the first transfer function provides incrementally increasing gain adjustments to the reproduced audio program signal as a function of an increasing average amplitude of the microphone output signal over a period of time during which said microphone output signal is enabled, and vice versa; the second transfer function provides incrementally increasing high frequency response of the reproduced audio program signal, and vice versa; and the least one signal process output signal is maintained during such times as the microphone output signal is disabled.

26. The method according to claim 25, wherein the incremental gain adjustments are in steps of between about 1 dB and about 10 dB.

27. The method according to claim 25, further comprising:
amplifying the at least one signal; and
coupling the first amplified output signal to a first speaker input of a first speaker.

28. The method according to claim 27, further comprising:
filtering the at least one signal process output signal using a low-pass filter to produce a filtered output signal;
amplifying the filtered output signal using a second amplifier to produce a second amplified output signal; and
coupling the second amplified output signal to a second speaker input of a second speaker.

* * * * *